(12) United States Patent
Guo

(10) Patent No.: US 10,741,792 B2
(45) Date of Patent: Aug. 11, 2020

(54) INORGANIC MATERIAL HAVING ALKOXY CHAIN ENCAPSULATING A DISPLAY PANEL

(71) Applicant: Wuhan China Star Optoelectronics Semiconductor Display Technology Co., Ltd., Wuhan (CN)

(72) Inventor: Tianfu Guo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/092,006

(22) PCT Filed: Aug. 9, 2018

(86) PCT No.: PCT/CN2018/099509
§ 371 (c)(1),
(2) Date: Oct. 8, 2018

(87) PCT Pub. No.: WO2019/223120
PCT Pub. Date: Nov. 28, 2019

(65) Prior Publication Data
US 2019/0355933 A1    Nov. 21, 2019

(30) Foreign Application Priority Data

May 21, 2018  (CN) .......................... 2018 1 0485968

(51) Int. Cl.
*H01L 29/08*     (2006.01)
*H01L 33/00*     (2010.01)
*H01L 31/0203*   (2014.01)
*H01L 21/00*     (2006.01)
*H01L 51/40*     (2006.01)
*H01L 51/52*     (2006.01)
(Continued)

(52) U.S. Cl.
CPC ...... *H01L 51/5256* (2013.01); *H01L 27/3262* (2013.01); *H01L 51/56* (2013.01); *H01L 2227/323* (2013.01)

(58) Field of Classification Search
CPC . H01L 51/5256; H01L 27/3262; H01L 51/56; H01L 51/5237
See application file for complete search history.

(56) References Cited

U.S. PATENT DOCUMENTS

| 8,772,824 B2 * | 7/2014 | Lee ...................... H01L 51/5246 257/100 |
| 2013/0092972 A1 * | 4/2013 | Kim .................... H01L 51/5256 257/100 |

(Continued)

*Primary Examiner* — Alonzo Chambliss

(57) ABSTRACT

The present disclosure provides a display panel and a method for manufacturing the same. The method includes forming a base layer, a thin film transistor (TFT) device layer, an organic light-emitting diode (OLED) device layer, and a first inorganic material in turn on a substrate; modifying a surface of the first inorganic material to increase flowability of an organic buffer layer that is to be formed on a surface of the first inorganic layer; and forming the organic buffer layer and a second inorganic layer in turn on the first inorganic layer. According to the present disclosure, flowability of the organic material formed on the inorganic material layer is increased.

18 Claims, 4 Drawing Sheets

(51) Int. Cl.
    *H01L 27/32*     (2006.01)
    *H01L 51/56*     (2006.01)

(56) References Cited

U.S. PATENT DOCUMENTS

| | | | |
|---|---|---|---|
| 2015/0021565 A1* | 1/2015 | Min | H01L 51/5256 257/40 |
| 2015/0048331 A1* | 2/2015 | Kwack | H01L 51/5253 257/40 |
| 2016/0028043 A1* | 1/2016 | Kwon | H01L 51/5253 257/40 |
| 2016/0190509 A1* | 6/2016 | Sato | H01L 27/3276 257/40 |
| 2016/0204375 A1* | 7/2016 | Ryu | H01L 51/5256 257/88 |
| 2016/0254479 A1* | 9/2016 | Jeong | H01L 51/5256 257/40 |

* cited by examiner

INORGANIC MATERIAL HAVING ALKOXY CHAIN ENCAPSULATING A DISPLAY PANEL

RELATED APPLICATIONS

This application is a National Phase of PCT Patent Application No. PCT/CN2018/099509 having International filing date of Aug. 9, 2018, which claims the benefit of priority of Chinese Patent Application No. 201810485968.6 filed on May 21, 2018. The contents of the above applications are all incorporated by reference as if fully set forth herein in their entirety.

FIELD AND BACKGROUND OF THE INVENTION

The present disclosure relates to the field of display technology, and more particularly to a display panel and a method for manufacturing the same.

In conventional display panels, an encapsulation layer is formed therein to prevent external water from contacting organic light-emitting materials disposed within display panels. Such design protects the organic light-emitting materials, and thus ensures long lifetime of the display panels.

The encapsulation layer of conventional display panels generally includes an inorganic material layer and an organic material layer. The inorganic material layer and the organic material layer are combined to increase sealing of organic light-emitting materials within the conventional display panels.

However, such conventional design has some problems, as described below.

There is a significant property difference in a cross-sectional direction between an inorganic material layer and an organic material layer. For example, as organic material is formed on an inorganic material layer, flowability of organic material on the inorganic material layer is poor. This is not helpful in increasing flatness of the organic material layer.

Therefore, there is a need to provide a new technique to solve problems encountered in the prior art.

SUMMARY OF THE INVENTION

The present disclosure provides a display panel and a method for manufacturing the same, which improves flowability of the organic material formed on the inorganic material layer.

To solve the aforementioned problems, the present disclosure provides the following technical schemes.

The present disclosure provides a method for manufacturing a display panel, comprising:

a step A of forming a base layer on a substrate;

a step B of forming a thin film transistor (TFT) device layer on the base layer;

a step C of forming an organic light-emitting diode (OLED) device layer on the TFT device layer;

a step D of forming a first inorganic material on the OLED device layer;

a step E of modifying a surface of the first inorganic material to form a first inorganic layer, wherein the first inorganic layer is configured to prevent water outside of the display panel from contacting the OLED device layer, and to increase flowability of an organic buffer layer that is to be formed on a surface of the first inorganic layer;

a step F of forming the organic buffer layer on the first inorganic layer; and a step G of forming a second inorganic layer on the organic buffer layer;

wherein the step E includes:

a step e1 of injecting a trimethyl aluminum gas towards the surface of the first inorganic material to have hydroxyl functional groups on the surface of the first inorganic material react with the trimethyl aluminum gas, so as to form aluminum containing hydrocarbon functional groups on the surface of the first inorganic material; and a step e2 of injecting a hydroxyl functional group containing alkyl alcohol gas towards the surface of the first inorganic material to transfer hydroxyl functional groups of the aluminum containing hydrocarbon functional groups on the surface of the first inorganic material into alkoxy chains;

wherein the organic buffer layer covers a plurality of foreign matter particulate on the first inorganic layer, and is configured to planarize the surface of the first inorganic layer having a device disposed underneath, and to release stress generated from the first inorganic layer; and wherein a contact angle of the organic buffer layer with the modified surface of the first inorganic layer is less than 5 degrees.

In accordance with the method for manufacturing the display panel of the present disclosure, the first inorganic layer includes a material selected from a group consisting of silicon nitride, silicon oxynitride, silicon oxycarbide, and any combinations thereof; and the organic buffer layer includes resin.

In addition, the present disclosure provides a method for manufacturing a display panel, comprising:

a step A of forming a base layer on a substrate;

a step B of forming a thin film transistor (TFT) device layer on the base layer;

a step C of forming an organic light-emitting diode (OLED) device layer on the TFT device layer;

a step D of forming a first inorganic material on the OLED device layer;

a step E of modifying a surface of the first inorganic material to form a first inorganic layer, wherein the first inorganic layer is configured to prevent water outside of the display panel from contacting the OLED device layer, and to increase flowability of an organic buffer layer that is to be formed on a surface of the first inorganic layer;

a step F of forming the organic buffer layer on the first inorganic layer; and a step G of forming a second inorganic layer on the organic buffer layer.

In accordance with the method for manufacturing the display panel of the present disclosure, the step E includes:

a step e1 of injecting a trimethyl aluminum gas towards the surface of the first inorganic material to have hydroxyl functional groups on the surface of the first inorganic material react with the trimethyl aluminum gas, so as to form aluminum containing hydrocarbon functional groups on the surface of the first inorganic material; and a step e2 of injecting a hydroxyl functional group containing alkyl alcohol gas towards the surface of the first inorganic material where aluminum containing hydrocarbon functional groups are formed, so as to transfer hydroxyl functional groups of the aluminum containing hydrocarbon functional groups on the surface of the first inorganic material into alkoxy chains.

In accordance with the method for manufacturing the display panel of the present disclosure, the hydroxyl functional group containing alkyl alcohol gas is selected from a group consisting of an ethanol gas, a methanol gas, and any combinations thereof.

In accordance with the method for manufacturing the display panel of the present disclosure, the step e1 includes:

injecting the trimethyl aluminum gas towards the surface of the first inorganic material at a first flow rate for a first duration, such that a force corresponding to a flow of the trimethyl aluminum gas is applied to the surface of the first inorganic material to have hydroxyl functional groups on the surface of the first inorganic material react with the trimethyl aluminum gas, and aluminum containing hydrocarbon functional groups are formed on the surface of the first inorganic material.

In accordance with the method for manufacturing the display panel of the present disclosure, the step e2 includes:

injecting the hydroxyl functional group containing alkyl alcohol gas towards the surface of the first inorganic material where aluminum containing hydrocarbon functional groups are formed at a second flow rate for a second duration, such that a force corresponding to a flow of the hydroxyl functional group containing alkyl alcohol gas is applied to the surface of the first inorganic material to have hydroxyl functional groups of the aluminum containing hydrocarbon functional groups react with the hydroxyl functional group containing alkyl alcohol gas, and hydroxyl functional groups of the aluminum containing hydrocarbon functional groups on the surface of the first inorganic material are transferred into alkoxy chains.

In accordance with the method for manufacturing the display panel of the present disclosure, the first inorganic layer includes a material selected from a group consisting of silicon nitride, silicon oxynitride, silicon oxycarbide, and any combinations thereof; and the organic buffer layer includes resin.

In accordance with the method for manufacturing the display panel of the present disclosure, the organic buffer layer covers a plurality of foreign matter particulate on the first inorganic layer, and is configured to planarize the surface of the first inorganic layer having a device disposed underneath, and to release stress generated from the first inorganic layer.

In accordance with the method for manufacturing the display panel of the present disclosure, a contact angle of the organic buffer layer with the modified surface of the first inorganic layer is less than 5 degrees.

Further, the present disclosure provides a display panel, comprising:

a substrate;

a base layer disposed on the substrate;

a thin film transistor (TFT) device layer disposed on the base layer;

an organic light-emitting diode (OLED) device layer disposed on the TFT device layer;

a first inorganic layer disposed on the OLED device layer, wherein the first inorganic layer is formed by forming a first inorganic material on the OLED device layer and modifying a surface of the first inorganic material, and wherein the first inorganic layer is configured to isolate the OLED device layer from water outside of the display panel, and to increase flowability of an organic buffer layer that is to be disposed on a surface of the first inorganic layer;

the organic buffer layer disposed on the first inorganic layer; and a second inorganic layer disposed on the organic buffer layer.

In accordance with the display panel of the present disclosure, the first inorganic layer is formed by:

injecting a trimethyl aluminum gas towards the surface of the first inorganic material to have hydroxyl functional groups on the surface of the first inorganic material react with the trimethyl aluminum gas, so as to form aluminum containing hydrocarbon functional groups on the surface of the first inorganic material; and injecting a hydroxyl functional group containing alkyl alcohol gas towards the surface of the first inorganic material where aluminum containing hydrocarbon functional groups are formed, so as to transfer hydroxyl functional groups of the aluminum containing hydrocarbon functional groups on the surface of the first inorganic material into alkoxy chains.

In accordance with the display panel of the present disclosure, the hydroxyl functional group containing alkyl alcohol gas is selected from a group consisting of an ethanol gas, a methanol gas, and any combinations thereof.

In accordance with the display panel of the present disclosure, the aluminum containing hydrocarbon functional groups is formed on the surface of the first inorganic material by injecting the trimethyl aluminum gas towards the surface of the first inorganic material at a first flow rate for a first duration, such that a force corresponding to a flow of the trimethyl aluminum gas is applied to the surface of the first inorganic material to have hydroxyl functional groups on the surface of the first inorganic material react with the trimethyl aluminum gas.

In accordance with the display panel of the present disclosure, the alkoxy chains is formed by injecting the hydroxyl functional group containing alkyl alcohol gas towards the surface of the first inorganic material where aluminum containing hydrocarbon functional groups are formed at a second flow rate for a second duration, such that a force corresponding to a flow of the hydroxyl functional group containing alkyl alcohol gas is applied to the surface of the first inorganic material to have hydroxyl functional groups of the aluminum containing hydrocarbon functional groups react with the hydroxyl functional group containing alkyl alcohol gas.

In accordance with the display panel of the present disclosure, the second inorganic layer includes a first bending portion at a side edge of the second inorganic layer, and the first bending portion encapsulates a side of a combined structure of the first inorganic layer and the organic buffer layer; and the first inorganic layer includes a second bending portion at a side edge of the first inorganic layer, and the second bending portion encapsulates a side of the OLED device layer.

In accordance with the display panel of the present disclosure, the organic buffer layer includes a third bending portion at a side edge of the organic buffer layer, and the third bending portion encapsulates the second bending portion of the first inorganic layer.

In accordance with the display panel of the present disclosure, the organic buffer layer covers a plurality of foreign matter particulate on the first inorganic layer, and is configured to planarize the surface of the first inorganic layer having a device disposed underneath, and to release stress generated from the first inorganic layer.

In accordance with the display panel of the present disclosure, the first inorganic layer includes a material selected from a group consisting of silicon nitride, silicon oxynitride, silicon oxycarbide, and any combinations thereof; and the organic buffer layer includes resin.

In accordance with the display panel of the present disclosure, a contact angle of the organic buffer layer with the modified surface of the first inorganic layer is less than 5 degrees.

According to the present disclosure, a modifying treatment is performed on the surface of the first inorganic material, and an organic buffer layer is formed on the modified surface of the first inorganic material, therefore contact angle of the organic buffer layer 106 with the surface of the first inorganic material can be reduced, and flowability of the organic buffer layer formed on the first inorganic layer can be increased.

To explain in detail the technical content of the above description, embodiments and drawings are provided.

DESCRIPTION OF SPECIFIC EMBODIMENTS OF THE INVENTION

The term "embodiment" used in the present specification refers to an example or an illustrated case. In addition, the term "a" used in the specification and claims is interpreted as "one or more", unless clearly defined from context to be of a singular form.

Figure 1:
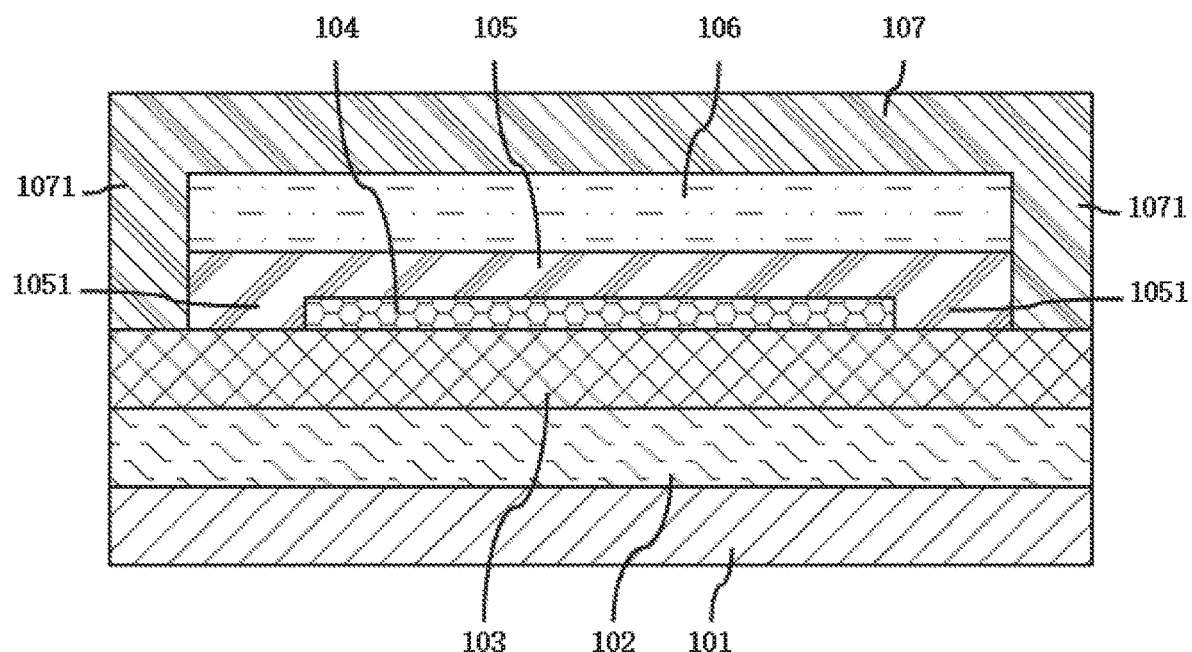
FIG. 1 is a cross-sectional view of a display panel according to a first embodiment of the present disclosure.
Figure 2:
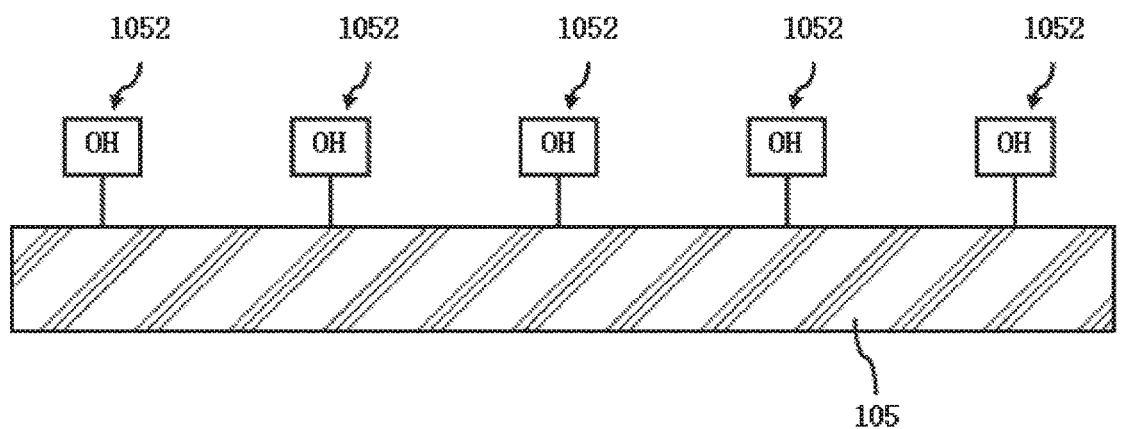
FIG. 2 is a schematic diagram showing a state of a first inorganic material corresponding to a first inorganic layer formed in the display panel of FIG. 1 before the first inorganic material is modified.
Figure 3:
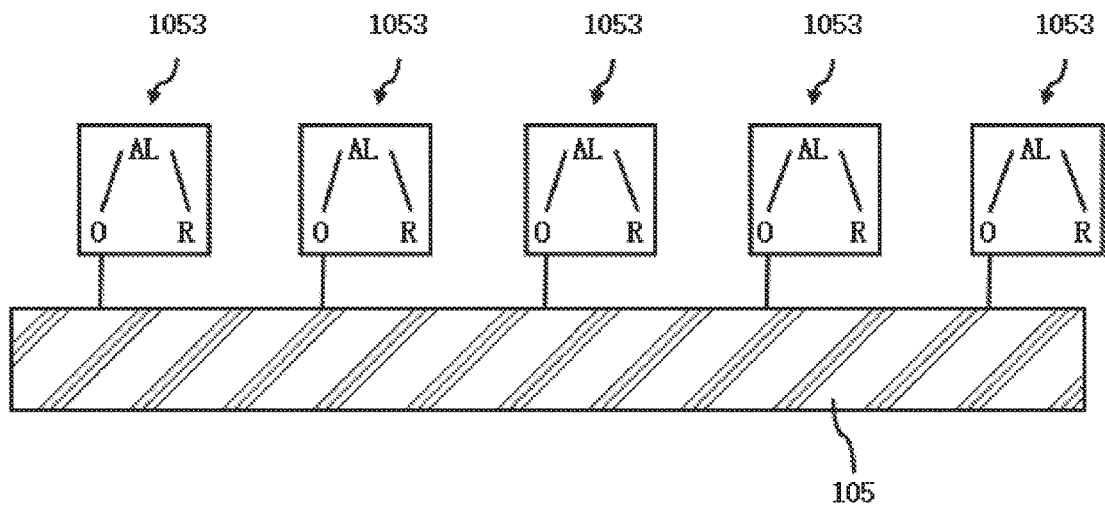
FIG. 3 is a schematic diagram showing the state of the first inorganic material corresponding to a first inorganic layer formed in the display panel of FIG. 1 after the first inorganic material is modified.

Please refer to FIGS. 1, 2, and 3. FIG. 1 is a cross-sectional view of a display panel according to a first embodiment of the present disclosure. FIG. 2 is a schematic diagram showing a state of a first inorganic material corresponding to a first inorganic layer 105 formed in the display panel of FIG. 1 before the first inorganic material is modified. FIG. 3 is a schematic diagram showing the state of the first inorganic material corresponding to a first inorganic layer 105 formed in the display panel of FIG. 1 after the first inorganic material is modified.

The display panel of the present embodiment includes a substrate 101, a base layer 102, a thin film transistor (TFT) device layer 103, an organic light-emitting diode (OLED) device layer 104, a first inorganic layer 105, an organic buffer layer 106, and a second inorganic layer 107.

The display panel of the present embodiment could be an organic light-emitting diode (OLED) display panel.

The base layer is 102 disposed on the substrate 101. The TFT device layer 103 is disposed on the base layer is 102. The OLED device layer 104 is disposed on the TFT device layer 103.

The first inorganic layer 105 is disposed on the OLED device layer 104. The first inorganic layer 105 is formed by forming a first inorganic material on the OLED device layer 104 and modifying a surface of the first inorganic material. The first inorganic layer 105 is configured to isolate the OLED device layer 104 from water outside of the display panel, and to increase flowability of the organic buffer layer 106 that is to be disposed on a surface of the first inorganic layer 105.

Modifying treatment herein refers to a treatment that transfers strong polar hydroxyl functional groups into weak polar or non-polar organic functional groups. The modifying treatment performed on the surface of the first inorganic material reduces a contact angle of the organic buffer layer 106 with the surface of the first inorganic layer 105 to be less than 5 degrees, and thus increases flowability of the organic buffer layer 106 that is to be disposed on the surface of the first inorganic layer 105.

The organic buffer layer 106 is disposed on the first inorganic layer 105. The second inorganic layer 107 is disposed on the organic buffer layer 106.

The first inorganic layer 105 includes a material selected from a group consisting of silicon nitride, silicon oxynitride, silicon oxycarbide, and any combinations thereof.

The organic buffer layer 106 includes resin. The base layer 102 is made of polyimide.

The first inorganic layer 105, the organic buffer layer 106, and the second inorganic layer 107 are combined to constitute an encapsulation layer. The encapsulation layer having a sandwich structure including the first inorganic layer 105, the organic buffer layer 106, and the second inorganic layer 107 is configured to prevent water outside of the display panel from entering the display panel and contacting the OLED device layer 104.

The first inorganic layer 105 is formed by performing steps of:

injecting a trimethyl aluminum gas towards the surface of the first inorganic material formed on the OLED device layer 104 to have hydroxyl functional groups 1052 on the surface of the first inorganic material react with the trimethyl aluminum gas, so as to form aluminum containing hydrocarbon functional groups on the surface of the first inorganic material; and injecting a hydroxyl functional group containing alkyl alcohol (R—OH) gas towards the surface of the first inorganic material where aluminum containing hydrocarbon functional groups are formed, so as to transfer hydroxyl functional groups (—OH) of the aluminum containing hydrocarbon functional groups on the surface of the first inorganic material into alkoxy chains (—O—R) 1053, wherein R is a weak polar alkyl chain.

The hydroxyl functional group containing alkyl alcohol gas is selected from a group consisting of an ethanol gas, a methanol gas, and any combinations thereof.

As an example in this embodiment, the aluminum containing hydrocarbon functional groups is formed on the surface of the first inorganic material by injecting the trimethyl aluminum gas towards the surface of the first inorganic material at a first flow rate for a first duration, such that a force corresponding to a flow of the trimethyl aluminum gas is applied to the surface of the first inorganic material to have hydroxyl functional groups 1052 on the surface of the first inorganic material react (completely react) with the trimethyl aluminum gas.

the alkoxy chains 1053 is formed by injecting the hydroxyl functional group containing alkyl alcohol gas towards the surface of the first inorganic material where aluminum containing hydrocarbon functional groups are formed at a second flow rate for a second duration, such that a force corresponding to a flow of the hydroxyl functional group containing alkyl alcohol gas is applied to the surface of the first inorganic material to have hydroxyl functional groups of the aluminum containing hydrocarbon functional groups react (completely react) with the hydroxyl functional group containing alkyl alcohol gas.

In this embodiment, the second inorganic layer 107 includes a first bending portion 1071 at a side edge of the second inorganic layer, and the first bending portion 1071 encapsulates a side of a combined structure of the first inorganic layer 105 and the organic buffer layer 106.

The first inorganic layer 105 includes a second bending portion 1051 at a side edge of the first inorganic layer, and the second bending portion 1051 encapsulates a side of the OLED device layer 104.

The organic buffer layer 106 covers a plurality of foreign matter particulate on the first inorganic layer 105, and is configured to planarize the surface of the first inorganic layer 105 having a device disposed underneath, and to release stress generated from the first inorganic layer 105.

Figure 4:
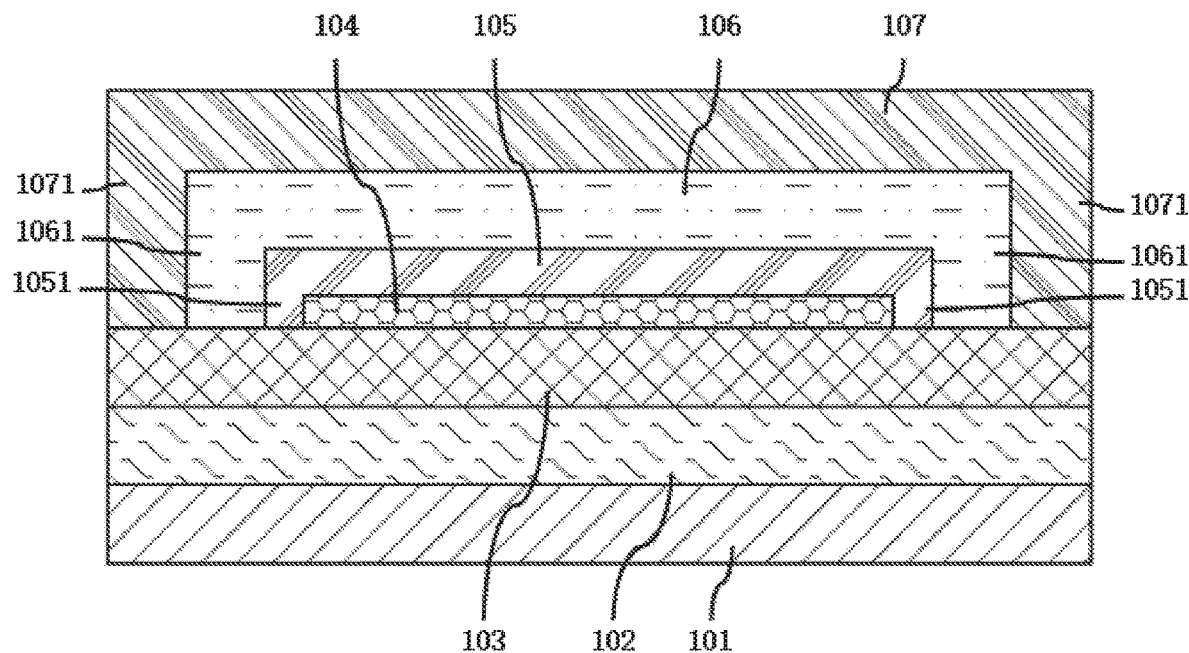
FIG. 4 is a cross-sectional view of a display panel according to a second embodiment of the present disclosure.

Please refer to FIG. 4, which is a cross-sectional view of a display panel according to a second embodiment of the present disclosure. The present embodiment differs from the first embodiment provided above in that the organic buffer layer 106 includes a third bending portion 1061 at a side edge of the organic buffer layer, and the third bending portion 1061 encapsulates the second bending portion 1051 of the first inorganic layer 105.

Figure 5:
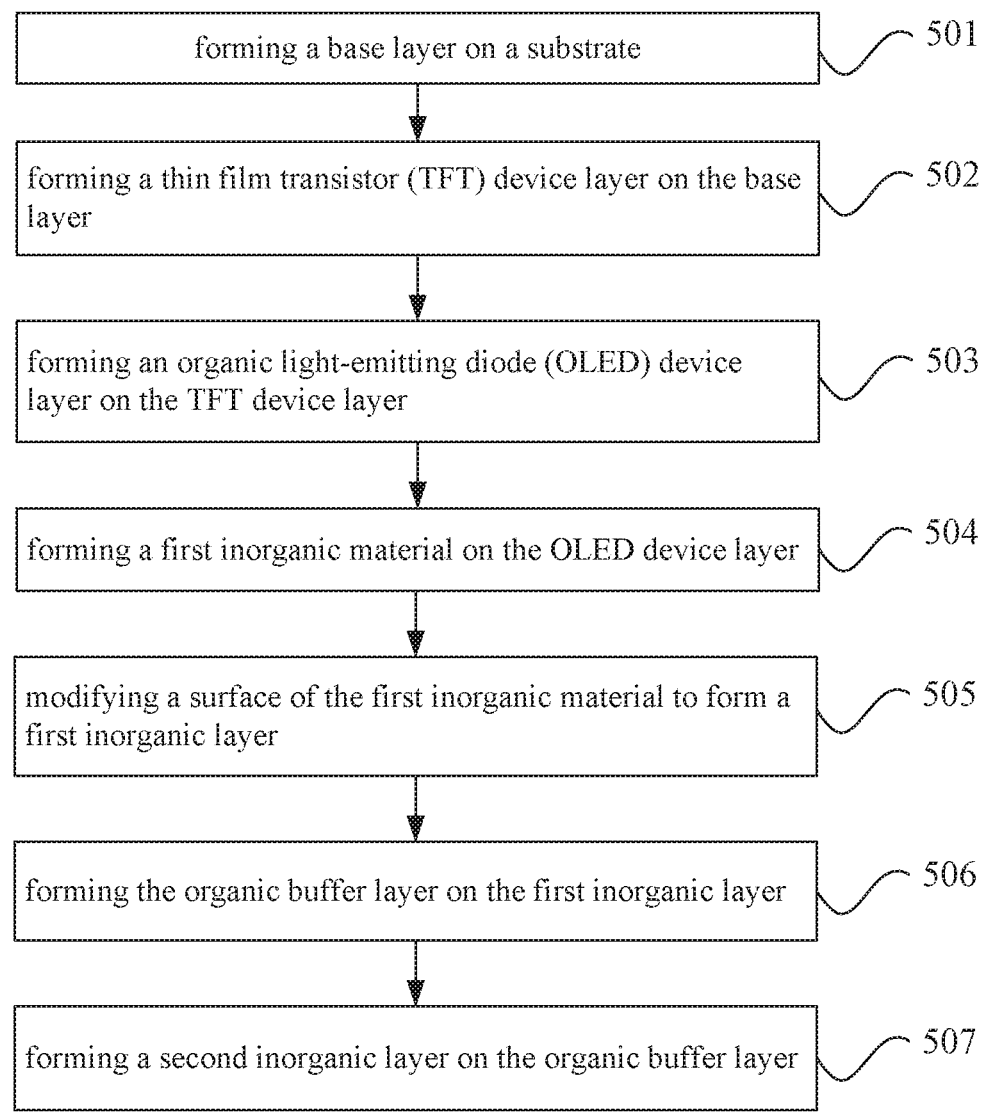
FIG. 5 is a flow chart showing steps of a method for manufacturing a display panel of the present disclosure.
Figure 6:
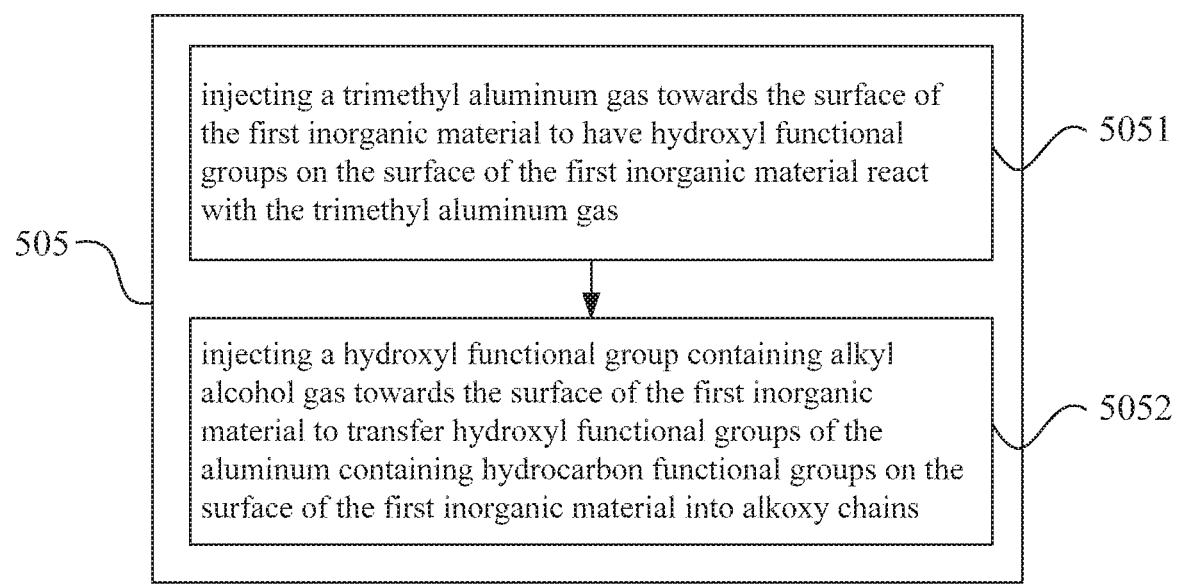
FIG. 6 is a flow chart showing steps of performing a modifying treatment on a surface of the first inorganic material for forming the first inorganic layer in the method for manufacturing a display panel of FIG. 5.

Please refer to FIGS. 5 and 6. FIG. 5 is a flow chart showing steps of a method for manufacturing a display panel of the present disclosure. FIG. 6 is a flow chart showing steps of performing a modifying treatment on a surface of the first inorganic material for forming the first inorganic layer 105 in the method for manufacturing a display panel of FIG. 5.

According to the present disclosure, a method for manufacturing a display panel includes:

a step A (501) of forming a base layer 102 on a substrate 101;

a step B (502) of forming a thin film transistor (TFT) device layer 103 on the base layer 102;

a step C (503) of forming an organic light-emitting diode (OLED) device layer 104 on the TFT device layer 103;

a step D (504) of forming a first inorganic material on the OLED device layer 104;

a step E (505) of modifying a surface of the first inorganic material to form a first inorganic layer 105, wherein the first inorganic layer 105 is configured to prevent water outside of the display panel from contacting the OLED device layer 104, and to increase flowability of an organic buffer layer 106 that is to be formed on a surface of the first inorganic layer 105, and wherein the modifying treatment refers to a treatment that transfers strong polar hydroxyl functional groups into weak polar or non-polar organic functional groups, and the modifying treatment performed on the surface of the first inorganic material reduces a contact angle of the organic buffer layer 106 with the surface of the first inorganic layer 105 to be less than 5 degrees, and thus increases flowability of the organic buffer layer 106 that is to be disposed on the surface of the first inorganic layer 105;

a step F (506) of forming the organic buffer layer 106 on the first inorganic layer 105; and a step G (507) of forming a second inorganic layer 107 on the organic buffer layer 106.

The first inorganic layer 105 includes a material selected from a group consisting of silicon nitride, silicon oxynitride, silicon oxycarbide, and any combinations thereof.

The organic buffer layer 106 includes resin. The base layer 102 is made of polyimide.

The organic buffer layer 106 covers a plurality of foreign matter particulate on the first inorganic layer 105, and is configured to planarize the surface of the first inorganic layer 105 having a device disposed underneath, and to release stress generated from the first inorganic layer 105.

The step E (505) includes:

a step e1 (5051) of injecting a trimethyl aluminum gas towards the surface of the first inorganic material to have hydroxyl functional groups 1052 on the surface of the first inorganic material react with the trimethyl aluminum gas, so as to form aluminum containing hydrocarbon functional groups on the surface of the first inorganic material; and a step e2 (5052) of injecting a hydroxyl functional group containing alkyl alcohol gas towards the surface of the first inorganic material to transfer hydroxyl functional groups of the aluminum containing hydrocarbon functional groups on the surface of the first inorganic material into alkoxy chains 1053.

The hydroxyl functional group containing alkyl alcohol gas is selected from a group consisting of an ethanol gas, a methanol gas, and any combinations thereof.

The step F (506) includes:

depositing material of the organic buffer layer 106 on the first inorganic layer 105, so as to form the organic buffer layer 106.

As an example in this embodiment, the step e1 (5051) includes injecting the trimethyl aluminum gas towards the surface of the first inorganic material at a first flow rate for a first duration, such that a force corresponding to a flow of the trimethyl aluminum gas is applied to the surface of the first inorganic material to have hydroxyl functional groups 1052 on the surface of the first inorganic material react (completely react) with the trimethyl aluminum gas, and aluminum containing hydrocarbon functional groups are formed on the surface of the first inorganic material; and the step e2 (5052) includes injecting the hydroxyl functional group containing alkyl alcohol gas towards the surface of the first inorganic material where aluminum containing hydrocarbon functional groups are formed at a second flow rate for a second duration, such that a force corresponding to a flow of the hydroxyl functional group containing alkyl alcohol gas is applied to the surface of the first inorganic material to have hydroxyl functional groups of the aluminum containing hydrocarbon functional groups react (completely react) with the hydroxyl functional group containing alkyl alcohol gas, and hydroxyl functional groups of the aluminum containing hydrocarbon functional groups on the surface of the first inorganic material are transferred into alkoxy chains 1053.

The step G (507) includes:

forming a second inorganic layer 107 on the organic buffer layer 106 and on a side of a combined structure of the first inorganic layer 105 and the organic buffer layer 106, wherein the second inorganic layer 107 includes a first bending portion 1071 at a side edge of the second inorganic layer, and the first bending portion 1071 encapsulates the side of the combined structure of the first inorganic layer 105 and the organic buffer layer 106.

The step D (504) includes:

forming a first inorganic material on the OLED device layer and on a side of the OLED device layer, wherein the first inorganic layer 105 includes a second bending portion 1051 at a side edge of the first inorganic layer, and the second bending portion 1051 encapsulates a side of the OLED device layer 104.

The step F (506) includes:

depositing material of the organic buffer layer 106 on the first inorganic layer 105 and on an outer side of the second bending portion 1051 of the first inorganic layer 105, so as to form the organic buffer layer 106, wherein the organic buffer layer 106 includes a third bending portion 1061 at a side edge of the organic buffer layer, and the third bending portion 1061 encapsulates the second bending portion 1051 of the first inorganic layer 105.

According to the present disclosure, a modifying treatment is performed on the surface of the first inorganic material, and an organic buffer layer 106 is formed on the modified surface of the first inorganic material, therefore contact angle of the organic buffer layer 106 with the surface of the first inorganic material can be reduced, and flowability of the organic buffer layer formed on the first inorganic layer can be increased.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a display panel, comprising:
    a step A of forming a base layer on a substrate;
    a step B of forming a thin film transistor (TFT) device layer on the base layer;
    a step C of forming an organic light-emitting diode (OLED) device layer on the TFT device layer;
    a step D of forming a first inorganic material on the OLED device layer;
    a step E of modifying a surface of the first inorganic material to form a first inorganic layer, wherein the first inorganic layer is configured to prevent water outside of the display panel from contacting the OLED device layer, and to increase flowability of an organic buffer layer that is to be formed on a surface of the first inorganic layer;
    a step F of forming the organic buffer layer on the first inorganic layer; and
    a step G of forming a second inorganic layer on the organic buffer layer;
    wherein the step E includes:
        a step e1 of injecting a trimethyl aluminum gas towards the surface of the first inorganic material to have hydroxyl functional groups on the surface of the first inorganic material react with the trimethyl aluminum gas, so as to form aluminum containing hydrocarbon functional groups on the surface of the first inorganic material; and
        a step e2 of injecting a hydroxyl functional group containing alkyl alcohol gas towards the surface of the first inorganic material to transfer hydroxyl functional groups of the aluminum containing hydrocarbon functional groups on the surface of the first inorganic material into alkoxy chains;
    wherein the organic buffer layer covers a plurality of foreign matter particulate on the first inorganic layer, and is configured to planarize the surface of the first inorganic layer having a device disposed underneath, and to release stress generated from the first inorganic layer; and
    wherein a contact angle of the organic buffer layer with the modified surface of the first inorganic layer is less than 5 degrees.

2. The method for manufacturing the display panel according to claim 1, wherein the first inorganic layer includes a material selected from a group consisting of silicon nitride, silicon oxynitride, silicon oxycarbide, and any combinations thereof; and
    wherein the organic buffer layer includes resin.

3. A method for manufacturing a display panel, comprising:
    a step A of forming a base layer on a substrate;
    a step B of forming a thin film transistor (TFT) device layer on the base layer;
    a step C of forming an organic light-emitting diode (OLED) device layer on the TFT device layer;
    a step D of forming a first inorganic material on the OLED device layer;
    a step E of modifying a surface of the first inorganic material to form a first inorganic layer, wherein the first inorganic layer is configured to prevent water outside of the display panel from contacting the OLED device layer, and to increase flowability of an organic buffer layer that is to be formed on a surface of the first inorganic layer;
    a step F of forming the organic buffer layer on the first inorganic layer; and
    a step G of forming a second inorganic layer on the organic buffer layer, wherein the step E includes:
    a step e1 of injecting a trimethyl aluminum gas towards the surface of the first inorganic material to have hydroxyl functional groups on the surface of the first inorganic material react with the trimethyl aluminum gas, so as to form aluminum containing hydrocarbon functional groups on the surface of the first inorganic material; and
    a step e2 of injecting a hydroxyl functional group containing alkyl alcohol gas towards the surface of the first inorganic material where aluminum containing hydrocarbon functional groups are formed, so as to transfer hydroxyl functional groups of the aluminum containing hydrocarbon functional groups on the surface of the first inorganic material into alkoxy chains.

4. The method for manufacturing the display panel according to claim 3, wherein the hydroxyl functional group containing alkyl alcohol gas is selected from a group consisting of an ethanol gas, a methanol gas, and any combinations thereof.

5. The method for manufacturing the display panel according to claim 3, wherein the step e1 includes:
    injecting the trimethyl aluminum gas towards the surface of the first inorganic material at a first flow rate for a first duration, such that a force corresponding to a flow of the trimethyl aluminum gas is applied to the surface of the first inorganic material to have hydroxyl functional groups on the surface of the first inorganic material react with the trimethyl aluminum gas, and aluminum containing hydrocarbon functional groups are formed on the surface of the first inorganic material.

6. The method for manufacturing the display panel according to claim 3, wherein the step e2 includes:
    injecting the hydroxyl functional group containing alkyl alcohol gas towards the surface of the first inorganic material where aluminum containing hydrocarbon functional groups are formed at a second flow rate for a second duration, such that a force corresponding to a flow of the hydroxyl functional group containing alkyl alcohol gas is applied to the surface of the first inorganic material to have hydroxyl functional groups of the aluminum containing hydrocarbon functional groups react with the hydroxyl functional group containing alkyl alcohol gas, and hydroxyl functional groups of the aluminum containing hydrocarbon functional groups on the surface of the first inorganic material are transferred into alkoxy chains.

7. The method for manufacturing the display panel according to claim 3, wherein the first inorganic layer includes a material selected from a group consisting of silicon nitride, silicon oxynitride, silicon oxycarbide, and any combinations thereof; and
wherein the organic buffer layer includes resin.

8. The method for manufacturing the display panel according to claim 3, wherein the organic buffer layer covers a plurality of foreign matter particulate on the first inorganic layer, and is configured to planarize the surface of the first inorganic layer having a device disposed underneath, and to release stress generated from the first inorganic layer.

9. The method for manufacturing the display panel according to claim 3, wherein a contact angle of the organic buffer layer with the modified surface of the first inorganic layer is less than 5 degrees.

10. A display panel, comprising:
a substrate;
a base layer disposed on the substrate;
a thin film transistor (TFT) device layer disposed on the base layer;
an organic light-emitting diode (OLED) device layer disposed on the TFT device layer;
a first inorganic layer disposed on the OLED device layer, wherein the first inorganic layer is formed by forming a first inorganic material on the OLED device layer and modifying a surface of the first inorganic material, and wherein the first inorganic layer is configured to isolate the OLED device layer from water outside of the display panel, and to increase flowability of an organic buffer layer that is to be disposed on a surface of the first inorganic layer;
the organic buffer layer disposed on the first inorganic layer; and
a second inorganic layer disposed on the organic buffer layer,
wherein the first inorganic layer is formed by:
injecting a trimethyl aluminum gas towards the surface of the first inorganic material to have hydroxyl functional groups on the surface of the first inorganic material react with the trimethyl aluminum gas, so as to form aluminum containing hydrocarbon functional groups on the surface of the first inorganic material; and
injecting a hydroxyl functional group containing alkyl alcohol gas towards the surface of the first inorganic material where aluminum containing hydrocarbon functional groups are formed, so as to transfer hydroxyl functional groups of the aluminum containing hydrocarbon functional groups on the surface of the first inorganic material into alkoxy chains.

11. The display panel according to claim 10, wherein the hydroxyl functional group containing alkyl alcohol gas is selected from a group consisting of an ethanol gas, a methanol gas, and any combinations thereof.

12. The display panel according to claim 10, wherein the aluminum containing hydrocarbon functional groups is formed on the surface of the first inorganic material by injecting the trimethyl aluminum gas towards the surface of the first inorganic material at a first flow rate for a first duration, such that a force corresponding to a flow of the trimethyl aluminum gas is applied to the surface of the first inorganic material to have hydroxyl functional groups on the surface of the first inorganic material react with the trimethyl aluminum gas.

13. The display panel according to claim 10, wherein the alkoxy chains is formed by injecting the hydroxyl functional group containing alkyl alcohol gas towards the surface of the first inorganic material where aluminum containing hydrocarbon functional groups are formed at a second flow rate for a second duration, such that a force corresponding to a flow of the hydroxyl functional group containing alkyl alcohol gas is applied to the surface of the first inorganic material to have hydroxyl functional groups of the aluminum containing hydrocarbon functional groups react with the hydroxyl functional group containing alkyl alcohol gas.

14. The display panel according to claim 10, wherein the second inorganic layer includes a first bending portion at a side edge of the second inorganic layer, and the first bending portion encapsulates a side of a combined structure of the first inorganic layer and the organic buffer layer; and
the first inorganic layer includes a second bending portion at a side edge of the first inorganic layer, and the second bending portion encapsulates a side of the OLED device layer.

15. The display panel according to claim 14, wherein the organic buffer layer includes a third bending portion at a side edge of the organic buffer layer, and the third bending portion encapsulates the second bending portion of the first inorganic layer.

16. The display panel according to claim 10, wherein the organic buffer layer covers a plurality of foreign matter particulate on the first inorganic layer, and is configured to planarize the surface of the first inorganic layer having a device disposed underneath, and to release stress generated from the first inorganic layer.

17. The display panel according to claim 10, wherein the first inorganic layer includes a material selected from a group consisting of silicon nitride, silicon oxynitride, silicon oxycarbide, and any combinations thereof; and
wherein the organic buffer layer includes resin.

18. The display panel according to claim 10, wherein a contact angle of the organic buffer layer with the modified surface of the first inorganic layer is less than 5 degrees.

* * * * *